(12) United States Patent
Maity et al.

(10) Patent No.: US 10,741,998 B2
(45) Date of Patent: Aug. 11, 2020

(54) THERMAL-MECHANICAL ADJUSTMENT FOR LASER SYSTEM

(71) Applicant: General Electric Company, Schenectady, NY (US)

(72) Inventors: Sandip Maity, Karnataka (IN); Ying Zhou, Shanghai (CN); David Peter Robinson, Lisburn (GB); Gamal Refai-Ahmed, Santa Clara, CA (US)

(73) Assignee: General Electric Company, Schenectady, NY (US)

( * ) Notice: Subject to any disclaimer, the term of this patent is extended or adjusted under 35 U.S.C. 154(b) by 212 days.

(21) Appl. No.: 14/995,558

(22) Filed: Jan. 14, 2016

(65) Prior Publication Data

US 2017/0104311 A1    Apr. 13, 2017

(30) Foreign Application Priority Data

Oct. 7, 2015 (IN) .......................... 3220/DEL/2015

(51) Int. Cl.

| G02B 13/00 | (2006.01) |
|---|---|
| G02B 3/00 | (2006.01) |
| H01S 5/06 | (2006.01) |
| H01S 5/00 | (2006.01) |
| H01S 5/024 | (2006.01) |
| G01N 21/31 | (2006.01) |
| H01S 5/022 | (2006.01) |
| H01S 5/02 | (2006.01) |
| H01S 5/068 | (2006.01) |
| H01S 5/34 | (2006.01) |

(52) U.S. Cl.
CPC ........... *H01S 5/0612* (2013.01); *G01N 21/31* (2013.01); *H01S 5/0071* (2013.01); *H01S 5/02446* (2013.01); *H01S 5/02469* (2013.01); *G01N 2201/0612* (2013.01); *H01S 5/02* (2013.01); *H01S 5/02212* (2013.01); *H01S 5/06821* (2013.01); *H01S 5/3401* (2013.01)

(58) Field of Classification Search
CPC .. H01S 5/0612; H01S 5/0071; H01S 5/02446; H01S 5/02469; H01S 5/06821; H01S 5/02212; H01S 5/02; H01S 5/3401; G01N 21/31; G01N 2201/0612

See application file for complete search history.

(56) References Cited

U.S. PATENT DOCUMENTS

| 5,171,346 A | 12/1992 | Hallett |
|---|---|---|
| 6,438,964 B1 * | 8/2002 | Giblin ................. A41D 13/005 62/259.3 |
| 6,822,996 B1 | 11/2004 | Pace et al. |

(Continued)

OTHER PUBLICATIONS

Extended European Search Report and Opinion issued in connection with corresponding EP Application No. 16191478.3 dated Apr. 3, 2017.

*Primary Examiner* — Alicia M Harrington
(74) *Attorney, Agent, or Firm* — Eversheds Sutherland (US) LLP

(57) ABSTRACT

Provided is a laser system that includes a laser head having a laser holder configured to house a laser beam and a lens for reflecting the laser beam at a predetermined wavelength, and a thermal-mechanical adjustment device disposed on the laser head and configured to adjust a temperature and an alignment of the laser beam, to maintain the predetermined wavelength of the laser beam.

13 Claims, 5 Drawing Sheets

(56) References Cited

U.S. PATENT DOCUMENTS

| | | |
|---|---|---|
| 8,173,986 B2 | 5/2012 | Holber et al. |
| 2003/0231690 A1 | 12/2003 | McDonald |
| 2005/0123008 A1 | 6/2005 | Daiber et al. |
| 2011/0216793 A1* | 9/2011 | Gaillard .............. H01S 5/02288 372/34 |
| 2013/0043071 A1* | 2/2013 | Subramaniam .......... H02G 5/10 174/70 B |
| 2015/0253501 A1* | 9/2015 | Li .......................... G02B 6/125 385/14 |

* cited by examiner

THERMAL-MECHANICAL ADJUSTMENT FOR LASER SYSTEM

I. CROSS REFERENCE TO PRIORITY CLAIM

This application claims the benefit of Indian Patent Application No. 3220/DEL/2015, filed Oct. 7, 2015.

II. TECHNICAL FIELD

The present invention relates generally to a laser system. In particular, the present invention relates to a laser system having a thermal-mechanical adjustment device.

III. BACKGROUND

Semiconductor lasers are used in many different applications. These applications can include monitoring systems and measurement systems. In a monitoring system for high-powered machinery such as a power transformer, a laser e.g., a quantum cascade laser (QCL) is used for detecting trace gases. Selection of the wavelength of the light emitted is determined by the temperature of the laser medium. Therefore, the laser assembly needs to be kept at a specific temperature to maintain accuracy of the wavelength thereof.

Current laser systems can employ a combination of fans and heat pipes to remove excess heat generated from the laser beam. However, fans can create undesired noise and vibrations, which increases the noise within the laser system.

IV. SUMMARY OF THE EMBODIMENTS

Embodiments of the present invention provide a laser system including a thermal-mechanical adjustment device capable of maintaining alignment of the laser beam and dissipating heat therefrom to maintain accuracy of the wavelength of the light output.

In one exemplary embodiment, a laser system is provided. The laser system includes a laser head including a laser holder configured to house a laser beam and a lens for reflecting the laser beam at a predetermined wavelength. Also included is a thermal-mechanical adjustment device disposed on the laser head. This device is configured to adjust a temperature and an alignment of the laser beam, to maintain the predetermined wavelength of the laser beam.

The foregoing has broadly outlined some of the aspects and features of various embodiments, which should be construed to be merely illustrative of various potential applications of the disclosure. Other beneficial results can be obtained by applying the disclosed information in a different manner or by combining various aspects of the disclosed embodiments. Accordingly, other aspects and a more comprehensive understanding may be obtained by referring to the detailed description of the exemplary embodiments taken in conjunction with the accompanying drawings, in addition to the scope defined by the claims.

V. DESCRIPTION OF THE DRAWINGS

Figure 1:
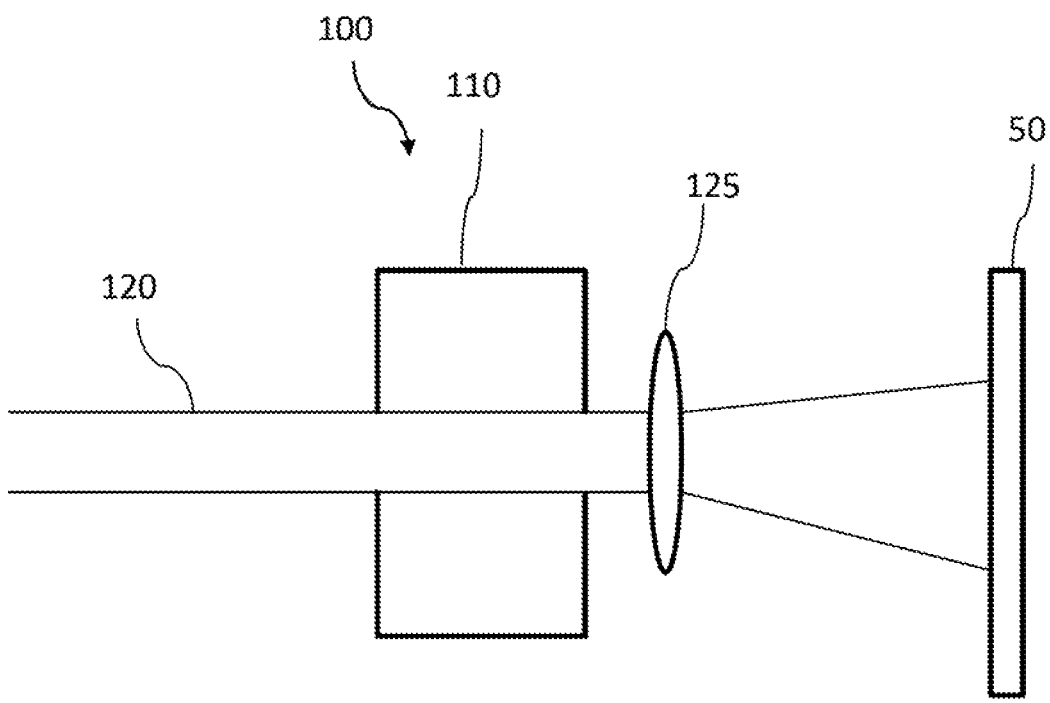
FIG. 1 is a schematic illustrating an example of a laser system that can be implemented within one or more embodiments of the present invention.

The drawings are only for purposes of illustrating preferred embodiments and are not to be construed as limiting the disclosure. Given the following enabling description of the drawings, the novel aspects of the present disclosure should become evident to a person of ordinary skill in the art. This detailed description uses numerical and letter designations to refer to features in the drawings. Like or similar designations in the drawings and description have been used to refer to like or similar parts of embodiments of the invention.

VI. DETAILED DESCRIPTION OF THE EMBODIMENTS

As required, detailed embodiments are disclosed herein. It must be understood that the disclosed embodiments are merely exemplary of various and alternative forms. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Embodiments of the present invention provide a laser system housing a laser holder for transmitting a laser beam therethrough, and a thermal-mechanical adjustment device capable of adjusting the temperature of the laser beam and maintaining the alignment of the laser beam. The thermal-mechanical adjustment device effectively maintains accuracy of the wavelength of the light output.

Details regarding the laser system 100 of the present invention will now be discussed with reference to FIGS. 1 through 3. FIG. 1 illustrates a laser system 100 used to perform various testing operations on target equipment 50 e.g., such as a power transformer. For example, the testing operations can include trace gases detection. The laser system 100 can be a semiconductor laser such as a quantum cascade laser (QCL). Other types of lasers could also be used with this laser system 100, for example telecommunication lasers, lead salt lasers, vertical cavity surface emitting laser (VCSEL), Hybrid silicon laser, InGaAsp laser, semiconductor laser diode, doped insulator lasers, or gas and chemical lasers, etc.

As further shown in FIG. 1, the laser system 100 includes a laser holder 110 for transmitting a laser beam 120 therethrough emitting from a laser source. One or more lens 125 are disposed downstream of the laser holder 110 for reflecting the laser beam 120 in a desired direction. In FIG. 2, the laser system 100 further includes a laser head (i.e., a mounting stand) 130 adjacent to the laser holder 110 holding the laser beam 120 and lens 125. The laser head 130 includes a chamfered opening 132, and a thermal-mechanical adjustment device 140 including a pivot bar 141 for maintaining the alignment of the laser beam 120. The laser head 130 can be formed of a metal material such as copper or any other suitable material.

Figure 2:
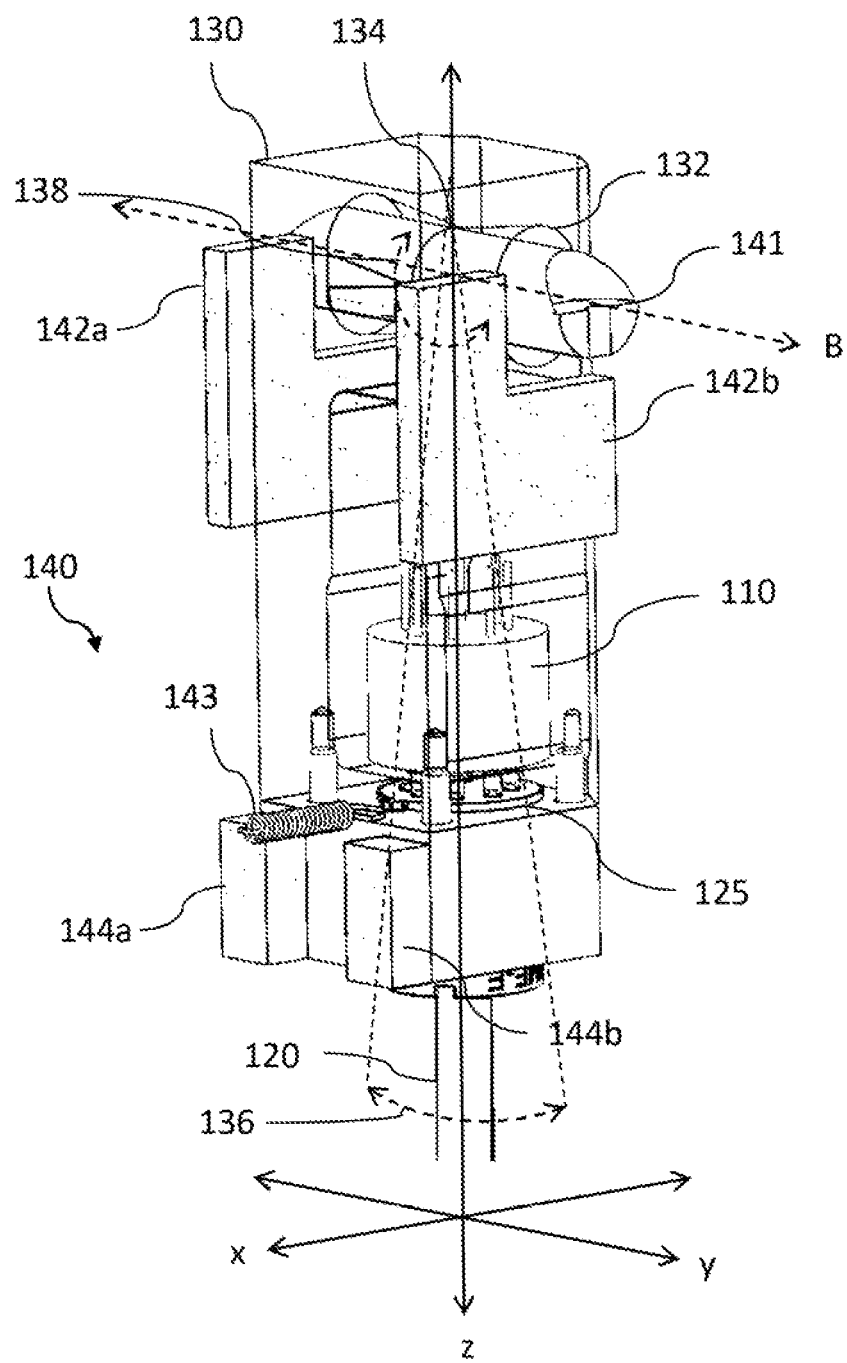
FIG. 2 is a detailed schematic of a thermal-mechanical adjustment device of the laser system of FIG. 1 that can be implemented within one or more embodiments.

Further in FIG. 2, the chamfered opening 132 of the laser head 130 is formed at one end of the laser head 130 opposite the emitting end of the laser beam 120 from the laser source, and is configured to house the pivot bar 141 therein. The pivot bar 141 is configured to allow pivot in conjunction with the chamfered opening and rotation of the laser beam 120 about its circumference at a pivot point (as depicted by dashed line 'A' in FIG. 3). The chamfered opening 132 is configured to allow the pivot bar 141 to sway at an angle of approximately 90° to the rotation of the pivot bar 141 (as depicted by dashed line 'B' in FIG. 3). Thus, the pivot bar 141 allows x and y axis alignment of the laser beam 120. When only 1-axis alignment is needed, the rotation around the pivot bar. Alternatively, when 2-axis alignment is needed, then both rotation and pivoting operations are performed.

The thermal-mechanical adjustment device 140 of the laser system 100 further includes a plurality of first thermally conductive portions 142a and 142b disposed at opposite sides of the laser head 130 adjacent to respective ends of the pivot bar 141. According to one or more embodiments, the thermally conductive portions 142a and 142b can be formed of thermally conductive foam or any other suitable material for the purposes set forth herein.

A spring device 143 is also provided and is disposed along the laser head 130 at another end of the laser head 130 opposite the end housing the pivot bar 141. Additionally, according to one or more embodiments, second thermally conductive portions 144a and 144b are disposed adjacent to the spring device 143. The second thermally conductive portions 144a and 144b can be formed of the same or different materials than that of the first thermally conductive portions 142a and 142b. The thermally conductive foam of the thermally conductive portions 142a, 142b, 144a and 144b provides a resistive force and has elastic restorative properties as well as being thermally conductive. Thus, the material could be used in conjunction with screws to allow precise alignment.

As shown in FIG. 2, the first thermally conductive portions 142a and 142b are L-shaped and the second thermally conductive portions 144a and 144b are rectangular-shaped. The present invention is not limited to the thermally conductive portions 142a, 142b, 144a and 144b being any particular shape or size, and may vary accordingly. Details regarding the operations of the first and second thermally conductive portions 142a, 142b, 144a and 144b and the spring device 143 will be discussed now with reference to FIGS. 3 through 4B.

Figure 3:
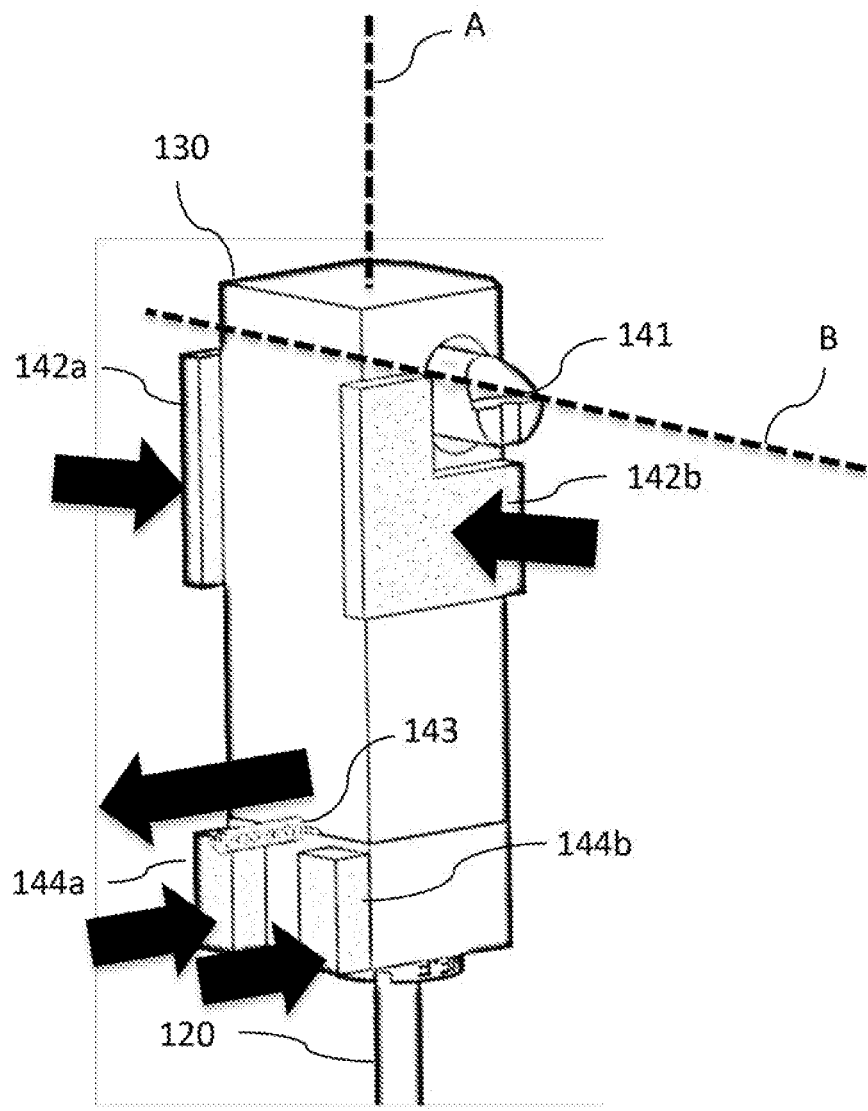
FIG. 3 is a schematic illustrating a mechanical adjustment operation of the thermal-mechanical adjustment device of FIG. 2 that can be implemented within one or more embodiments of the present invention.

FIG. 3 is a schematic illustrating a mechanical adjustment operation to be performed by the thermal-mechanical adjustment device 140 according to one or more embodiments of the present invention.

As shown in FIG. 3, as indicated by the arrows, the first and second thermally conductive portions 142a, 142b, 144a and 144b are configured to apply a resistive (i.e., pushing) force to the laser head 130, while the spring device 143 is configured to apply a pulling force to the laser head 130, to assist with adjustment of the laser beam 120 being transmitted therethrough.

When the laser beam 120 is transmitted through the laser head 130, the first and second thermally conductive portions 142a, 142b, 144a and 144b along with the spring device 143 maintain the alignment of the laser beam, thereby maintaining the accuracy of the wavelength. The first and second thermally conductive portions 142a, 142b, 144a and 144b also dissipate heat from the laser system 100.

Figure 4A:
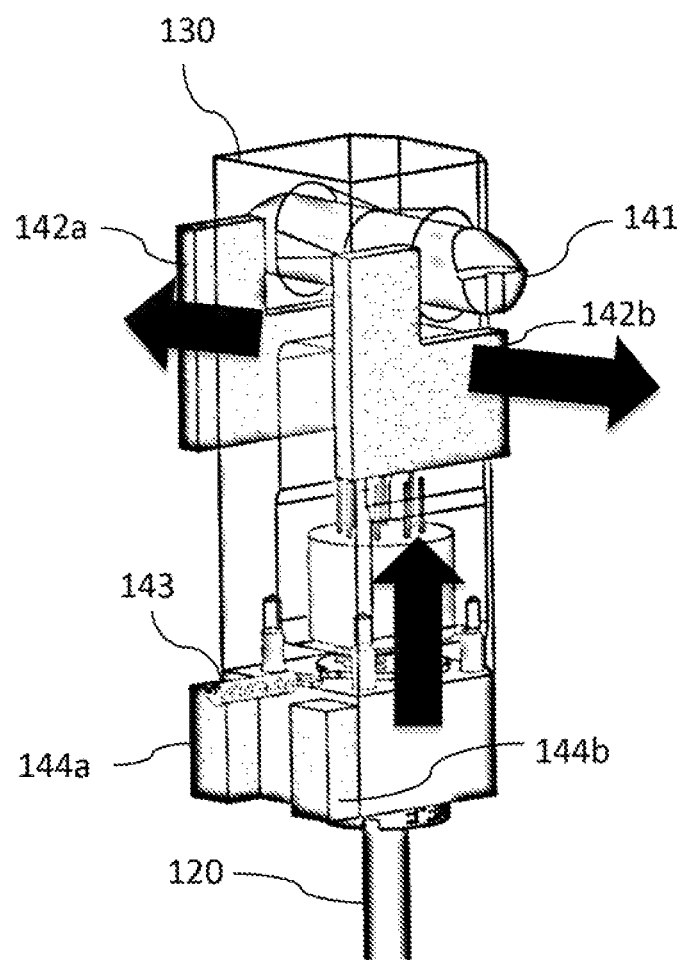
FIGS. 4A and 4B are schematics illustrating a heat dissipation operation of the thermal-mechanical adjustment device of FIG. 2 that can be implemented within one or more embodiments of the present invention.
Figure 4B:
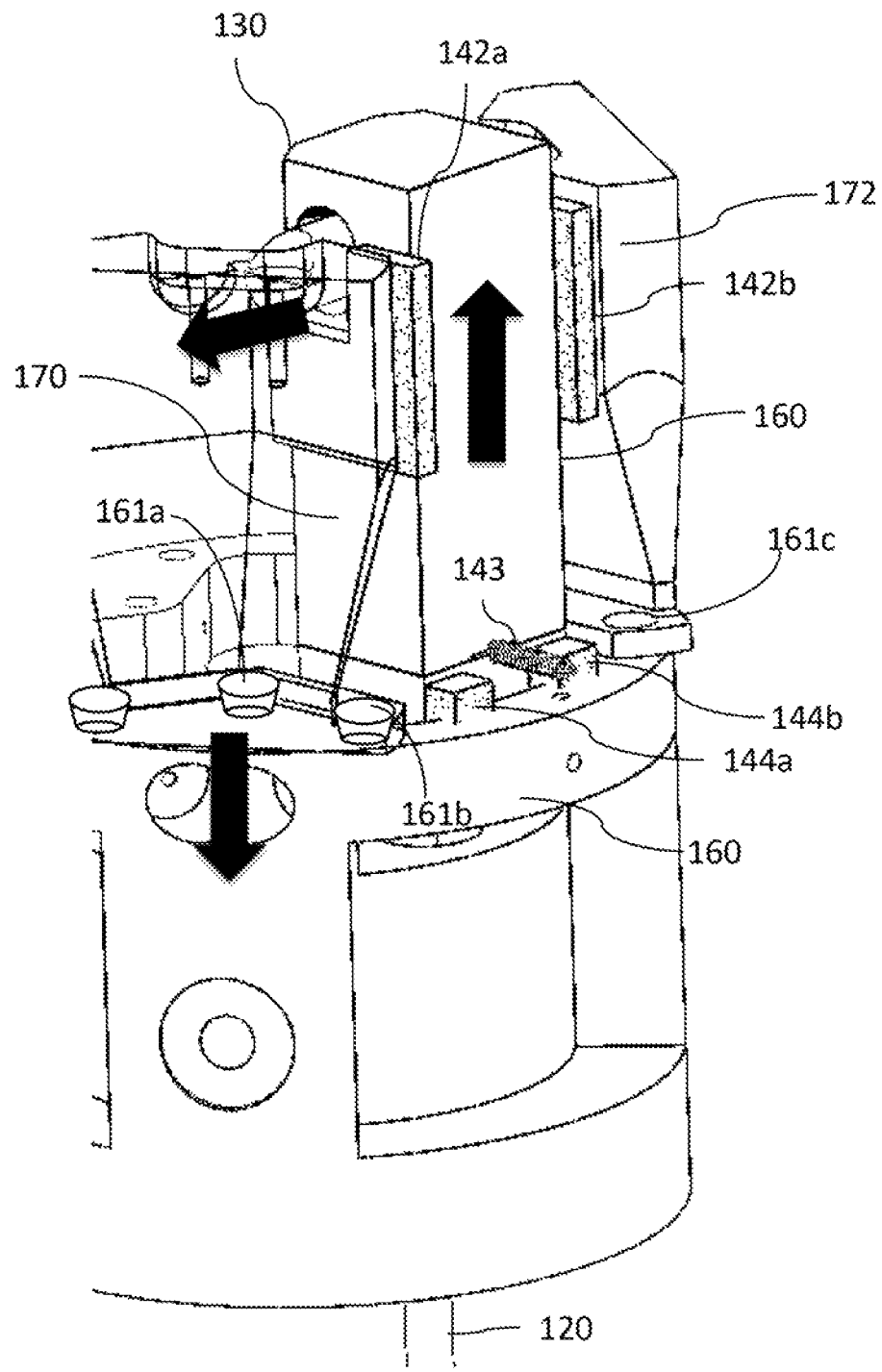

FIGS. 4A and 4B are schematics illustrating a heat dissipation operation of the thermal-mechanical adjustment device 140 that can be implemented within one or more embodiments of the present invention.

As shown in FIG. 4A, as indicated by the arrows, the first and second thermally conductive portions 142a, 142b, 144a and 144b are further configured to transfer heat generated by the laser beam 120 away from the laser head 130. Thus, the first and second thermally conductive portions 142a, 142b, 144a and 144b assist with maintaining the temperature of the laser beam 120 to a specific temperature range of approximately 20 to 40 degrees Celsius.

In some embodiments, the laser system 100 can be mounted to a mounting base 160 as shown in FIG. 4B. In this embodiment, the laser head 130 is secured to mounting base 160 via one or more set screws 161a, 161b and 161c. The first and second thermally conductive portions 142a, 142b, 144a and 144b are further configured to apply a pushing force against the force of the set screws 161a, 161b and 161c to maintain accuracy of the alignment of the laser beam 120.

Further, the heat transferred away from the laser head 130 via the first and second thermally conductive portions 142a, 142b, 144a and 144b is further transferred to the mounting base 160 to be dissipated therefrom (as indicated by the arrows). The heat can be disposed of via a heat pipe, heat sink or other heat dissipating mechanism attached to the mounting base 160. The laser system 100 of the present invention therefore effectively maintains the temperature of the laser beam 120.

Embodiments of the present invention provides the advantages of dissipating heat and mechanically aligning the laser beam of the laser system using the same components (i.e., the thermally conductive portions) employed therein. Further, the present invention provides a laser system without use of a fan to thereby avoid unwanted noise and vibrations in the laser system.

This written description uses examples to disclose the invention including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A laser system comprising:
   a laser head including:
      a laser holder configured to house a laser beam source;
      a lens for reflecting a laser beam from the laser beam source; and
      an opening in a housing of the laser head that is configures to receive a bar therethrough, wherein the opening includes opposed open ends and a fulcrum in between the opposed open ends, wherein a first cross-sectional area of the opening at a first one of the opposed open ends is greater than a second cross-sectional area of the opening at the fulcrum and wherein a third cross-sectional area of the opening at a second one of the opposed open ends is greater than the second cross-sectional area of the opening at the fulcrum.

2. The laser system of claim 1, wherein the opening is formed at one end of the laser head that is opposite an emitting end of the laser head through which the laser beam is emitted.

3. The laser system of claim 1, wherein each of the first and third cross-sectional areas at the opposed open ends of the opening has a flat oval shape.

4. The laser system of claim 3, wherein the second cross-sectional area of the opening at the fulcrum of the opening has a circular shape.

5. The laser system of claim 4, wherein the fulcrum of the opening defines a pivot point for the laser beam and the opposed open ends define limits of rotation of the laser head about the pivot point.

6. The laser system of claim 4, wherein the bar has a circular cross-sectional area.

7. The laser system of claim 1, further comprising:
a mounting base secured to the laser head; and
one or more set screws threadedly secured to the mounting base and the laser head.

8. The laser system of claim 1, further comprising:
a first thermally conductive portion abutting the laser head;
a second thermally conductive portion abutting the laser head, opposite the first thermally conductive portion.

9. The laser system of claim 8, wherein the laser head comprises:
a first end and a second end; and
a spring coupled to the laser head adjacent to the second end, wherein the pivot bar is disposed adjacent to the first end.

10. The laser system of claim 1, comprising a thermally conductive elastic component extending from a side surface of the laser head.

11. A laser system comprising:
a laser head including:
a laser holder configured to house a laser beam source; and
a lens for reflecting a laser beam from the laser beam source;
means for applying a pulling force to the laser head in a first direction; and
means for applying a resistive force, wherein the means for applying a resistive force is positioned in between the laser head and an adjacent structure, wherein the means for applying a resistive force is a thermally conductive material.

12. The laser system of claim 11, wherein the means for applying a resistive force is a foam material.

13. A laser system comprising:
a laser head including:
a laser holder configured to house a laser beam source;
a lens for reflecting a laser beam from the laser beam source; and
an opening in a housing of the laser head that is configured to receive a bar therethrough, wherein the opening narrows from a first one of opposed open ends of the opening toward a center of the opening and the opening narrows from a second one of the opposed open ends toward the center of the opening.

* * * * *